(12) United States Patent
Aikawa et al.

(10) Patent No.: US 6,756,857 B2
(45) Date of Patent: Jun. 29, 2004

(54) PLANAR CIRCUIT

(75) Inventors: Masayoshi Aikawa, 26-11, Nara 2-chome, Aoba-ku, Yokohama-shi, Kanagawa (JP); Eisuke Nishiyama, Saga (JP); Takayuki Tanaka, Saga (JP); Fumio Asamura, Saitama (JP); Takeo Oita, Saitama (JP)

(73) Assignees: Nihon Dempa Kogyo Co., Ltd., Tokyo (JP); Masayoshi Aikawa, Yokohama (JP)

( * ) Notice: Subject to any disclaimer, the term of this patent is extended or adjusted under 35 U.S.C. 154(b) by 0 days.

(21) Appl. No.: 10/255,266

(22) Filed: Sep. 26, 2002

(65) Prior Publication Data

US 2003/0062963 A1 Apr. 3, 2003

(30) Foreign Application Priority Data

Sep. 28, 2001  (JP) ...................................... 2001-302483

(51) Int. Cl.[7] ............................................... H03P 7/10
(52) U.S. Cl. ................................ 331/177 V; 333/219.1
(58) Field of Search ....................... 331/96, 173, 177 V, 331/107 DP, 117 D; 333/219, 219.1, 235

(56) References Cited

U.S. PATENT DOCUMENTS

| | | | | |
|---|---|---|---|---|
| 4,754,237 A | * | 6/1988 | Stern et al. .................. 333/1.1 |
| 5,396,202 A | * | 3/1995 | Scheck ........................ 333/230 |
| 5,801,660 A | * | 9/1998 | Ohtsuka et al. ........ 343/700 MS |
| 5,920,245 A | * | 7/1999 | Ishikawa et al. ............ 333/248 |
| 6,204,739 B1 | * | 3/2001 | Sakamoto et al. ........ 333/219.1 |
| 6,246,295 B1 | * | 6/2001 | Matsui et al. .................. 331/99 |
| 6,360,111 B1 | * | 3/2002 | Mizuno et al. ............. 505/210 |
| 6,597,260 B2 | * | 7/2003 | Sasaki et al. ............... 333/134 |

* cited by examiner

Primary Examiner—Robert Pascal
Assistant Examiner—Joseph Chang
(74) Attorney, Agent, or Firm—Katten Muchin Zavis Rosenman

(57) ABSTRACT

A planar circuit has a substrate, a planar circuit conductor disposed on a first main surface of the substrate, a ground conductor disposed on a second main surface of the substrate for creating a high frequency resonator based on an electromagnetic wave field in cooperation with the planar circuit conductor, and a circuit element disposed on an opening formed in at least one of the planar circuit conductor and ground conductor to electronically control the electromagnetic wave field. The circuit element may be a variable reactance element such as a varactor diode, or a switching element. The circuit element can variably control the electromagnetic wave field which defines the resonator, so that the resonator can be controlled, for example, to resonate at a variable frequency.

18 Claims, 7 Drawing Sheets

PLANAR CIRCUIT

BACKGROUND OF THE INVENTION

1. Field of the Invention

The present invention relates to a planar circuit for use in a resonator, an oscillator, an antenna, and the like in high frequency bands such as a microwave band, and more particularly, to a planar circuit which is suitable for enhancing the functionality and facilitates the manufacturing to achieve a reduction in cost.

2. Description of the Related Art

A variety of planar circuits based on the microwave integrated circuit technology are used in, for example, wireless communication system apparatuses and measuring apparatuses for implementing resonators, oscillators, antennas, and the like, and the demand for the planar circuits tends to increase year by year. In recent years, these planar circuits are also required to provide higher functionality and facilitate the manufacturing from a viewpoint of achieving higher performance of a variety of devices and improving the productivity.

FIGS. 1A and 1B are a plan view and a cross-sectional view, respectively, of a resonator which comprises a typical conventional planar circuit. Here, the figures illustrate an oscillator which utilizes a resonator.

The resonator comprises circuit conductor 2 having a circular plane shape shaped on one main surface of substrate 1 made of a dielectric material, and ground conductor 3 formed on the entirety of the other main surface of substrate 1. This type of resonator is called the "planar resonator". In this configuration, a TM mode resonator is formed by an electric field generated between circuit conductor 2 and ground conductor 3 and a magnetic field associated therewith. As appreciated, the oscillation frequency at which the oscillator operates depends on dielectric coefficient E and thickness d of substrate 1, and area S of circuit conductor 2.

The circuit illustrated in FIGS. 1A and 1B further comprises Gunn diode 6 embedded in substrate 1, which forms the planar resonator, to make up an oscillator. Generally, Gunn diode 6 is placed within a through hole formed through substrate 1, and both ends of Gunn diode 6 are connected to circuit conductor 2 and ground conductor 3, respectively, for example by soldering. Then, Gunn diode 6 functions as an amplifier for oscillation to implement an oscillator circuit for amplifying and feeding back a resonant frequency component of the resonator. The resonator serves for phase synchronization and power combination as well as functions as a resonant element of the oscillator circuit. Lead line 4 extending from circuit conductor 2, and capacitive line 5 branched lead line 4 for matching are also disposed on the one main surface of substrate 1.

FIGS. 2A and 2B are a plan view and a cross-sectional view, respectively, of a planar antenna, i.e., an antenna which comprises a planar circuit.

This planar antenna comprises circuit conductor 2 having, for example, a square plane shape on one main surface of substrate 1; ground conductor 3 having an opening 7 as an intermediate layer of substrate 1; and a conductive line serving as signal line 8 on the other main surface of substrate 1. In this configuration, a planar resonator is formed by circuit conductor 2 and ground conductor 3, while a microstrip line is formed by signal line 8 and ground conductor 3. The microstrip line forms a high frequency transmission line by the action of an electric field generated between signal line 8 and ground conductor 3, and a magnetic field associated therewith. Thus, an antenna is implemented for transmitting or receiving electromagnetic waves at a resonant frequency of the planar resonator and fed through the microstrip line. The planar resonator is electromagnetically coupled to the microstrip line through opening 7 extending through ground conductor 3 which is provided as an intermediate layer.

However, both planar circuits based on a planar resonator configured as described above experience difficulties in changing the electric characteristics, so that the resonant frequency is obliged to remain fixed. It is therefore difficult to design the planar circuit to generate a variable resonant frequency, by way of example, thereby providing a highly functional planar circuit. Specifically, the electric characteristics of a planar resonator depend on a fixed electromagnetic wave field based on a boundary condition defined by a geometric shape, a connection condition of input and output lines, component materials, and the like. Thus, difficulties exist in designing a variable planar circuit. In essence, it can be said that current planar circuits, i.e., planar resonators still remain unchanged from simple utilization of the electromagnetic wave field fixedly set by given conditions.

Also, as illustrated by the exemplary configuration of the planar oscillator using Gunn diode 6, conventionally, a circuit element comprising a semiconductor device including an integrated circuit and an active circuit, a positive element, and the like is typically embedded in substrate 1 between circuit conductor 2 and ground conductor 3 and connected to conductors 2, 3. Such a configuration requires a step of piercing substrate 1 in the manufacturing, thereby giving rise to problems of making highly accurate manufacturing difficult to cause a lower productivity, and making the circuit element incompatible with surface mounting.

For disposing a circuit element on a surface of a substrate, for example, for disposing the aforementioned Gunn diode 6 on the one main surface of substrate 1, circuit conductor 2 must be connected to ground conductor 3 through a so-called via-hole, i.e., electrode through hole. In this event, however, the via hole causes an increase in the conductor length or line length to increase an inductance component, resulting in deteriorated high frequency characteristics. Therefore, conventionally, the circuit element is embedded in subrtrate 1 to reduce the line length for preventing the high frequency characteristics from being deteriorated.

SUMMARY OF THE INVENTION

It is an object of the present invention to provide a planar circuit which is capable of variably controlling an electromagnetic wave field to significantly improve the functionality and performance, and achieving a higher productivity resulting from the ease of manufacturing.

The object of the present invention is achieved by a planar circuit which includes a substrate, a planar circuit conductor disposed on a first main surface of the substrate, a ground conductor disposed on a second main surface of the substrate for creating a high frequency resonator based on an electromagnetic wave field in cooperation with the planar circuit conductor, and a circuit element disposed on an opening formed in at least one of the planar circuit conductor and the ground conductor, and connected to the at least one conductor along the periphery of the opening to electronically control the electromagnetic wave field.

Used as the circuit element may be a variable reactance element such as a varactor diode, and a switching element such as a PIN diode, Schottky barrier diode and the like, and furthermore an MMIC (monolithic microwave integrated circuit) and the like. Such a circuit element is connected to the planar circuit conductor or the ground conductor at least two points along the periphery of the opening.

In the present invention, an opening is formed in at least one of the planar circuit conductor and ground conductor which makes up a planar resonator, and the circuit element is disposed in the opening for electronically controlling the electromagnetic wave field. As a result, the boundary condition for the planar circuit can be equivalently changed to change the electromagnetic wave field, thereby realizing a variable planar circuit. Since the circuit element is disposed in the opening formed on one main surface of the substrate, surface mounting can be employed for mounting the circuit element to facilitate the manufacturing. When a variable reactance element is used as the circuit element, the characteristic of the electromagnetic wave field can be changed to vary the resonant frequency. Alternatively, when a switching element is used as the circuit element, the switching element can be controlled ON/OFF to select the resonant condition of the planar resonator to be operative or inoperative. In addition, when the planar resonator is designed to have degenerated resonance modes and a switching element is used as the circuit element, one of the degenerated resonance modes can be selected.

DETAILED DESCRIPTION OF THE INVENTION

Figure 3A:
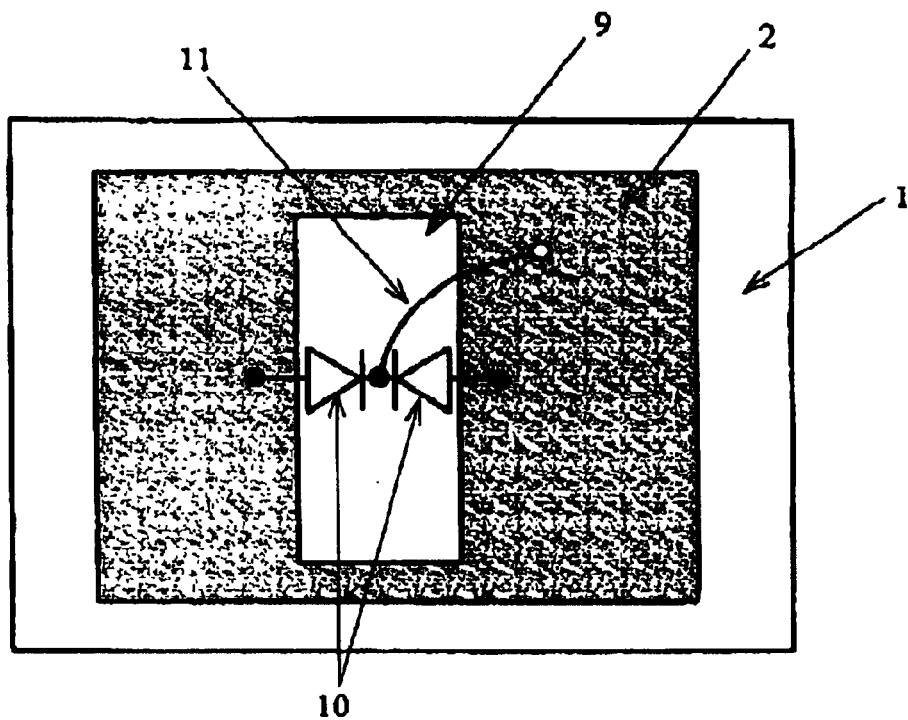
FIGS. 3A and 3B are a plan view and a cross-sectional view, respectively, illustrating a variable planar resonator according to a first embodiment of the present invention.
Figure 3B:
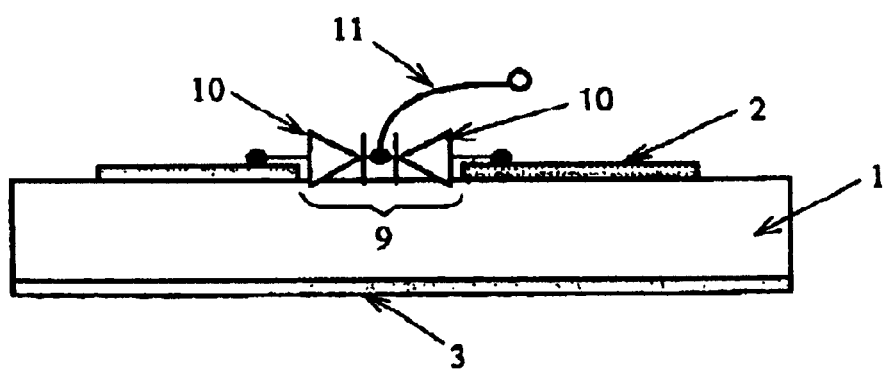

A first embodiment of the present invention will be described in connection with an exemplary variable planar resonator to which a planar circuit of the present invention is applied. The variable planar resonator according to the first embodiment illustrated in FIGS. 3A and 3B comprises substrate 1 made of a dielectric material or the like; circuit conductor 2 which serve as a planar circuit conductor and has a square plane shape disposed on one main surface of substrate 1; and ground conductor formed on the overall other main surface of substrate 1. Circuit conductor 2 is formed with rectangular opening 9. A pair of varactor diodes 10 are connected in series, with their cathodes connected to each other, and one end of supply terminal 11 is connected to a common connection of varactor diodes 10 for applying a control voltage thereto. The pair of varactor diodes 10 have their anodes connected to circuit conductor 2 on both sides of opening 9, respectively. The anodes of varactor diodes 16 are each connected substantially at a midpoint of each long side of opening 9. With varactor diodes 10 thus connected, the control voltage applied between supply terminal 11 and circuit conductor 2 permits the capacitance to vary between both ends of the pair of varactor diodes 10 connected in opposite polarity configuration.

In the circuit configured as described, a planar resonator is formed between circuit conductor 2 having opening 9 and ground conductor 3. In this event, since a pair of varactor diodes 10 are disposed within opening 9, the electrical length of opening 9, i.e., opening length is equivalently changed in response to a change in the capacitance of varactor diodes 10. Thus, a change in the capacitance of varactor diodes 10 results in a like change in a boundary condition for forming an electromagnetic wave field, causing an eventual change in the resonant frequency. From the foregoing, according to this configuration, the resonant frequency of the planar resonator can be varied by changing the capacitance of varactor diodes 10 with the control voltage.

Consequently, in the first embodiment, the, electromagnetic wave field conventionally defined by fixed conditions can be electronically controlled by a variable capacitance element represented by varactor diodes 10 disposed in opening 9 formed in circuit conductor 2, thereby making it possible to form a variable resonator. In addition, since the capacitance of varactor diodes 10 as the variable capacitance element can be arbitrarily controlled with the control voltage, the adaptability and versatility are significantly improved as a resonator to enhance the functionality of the planar resonator. Further, since varactor diodes 10 need not be embedded in substrate 1 but can be mounted on one main surface of substrate 1, the manufacturing process is simplified to improve the productivity.

Figure 1A:
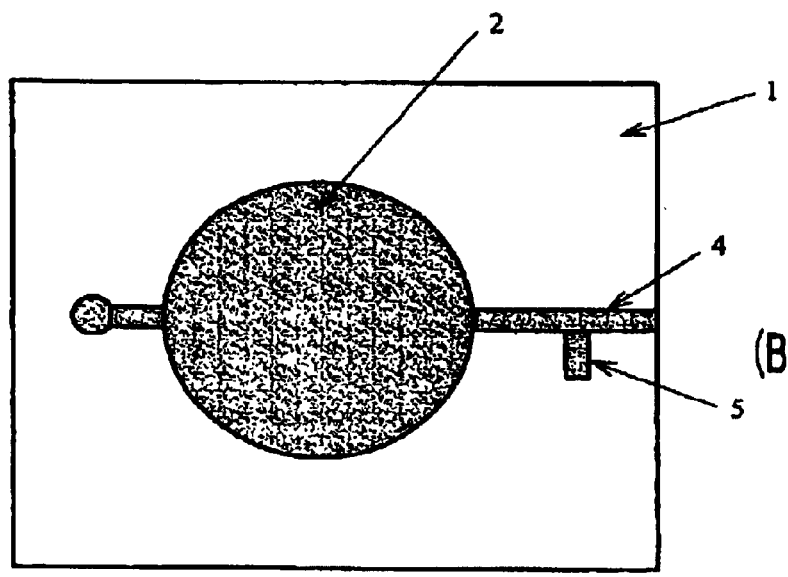
FIGS. 1A and 1B are a plan view and a cross-sectional view, respectively, illustrating a conventional planar circuit designed as a planar oscillator.
Figure 1B:
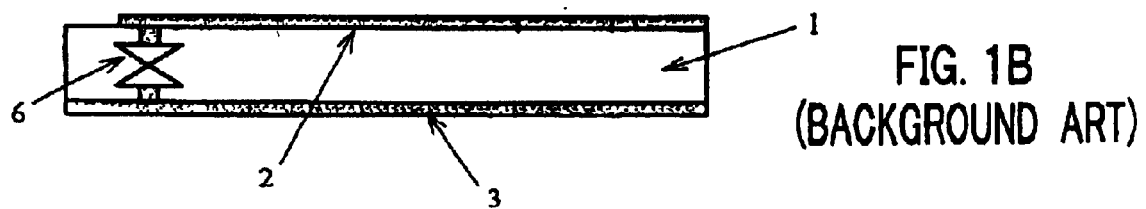
Figure 2A:
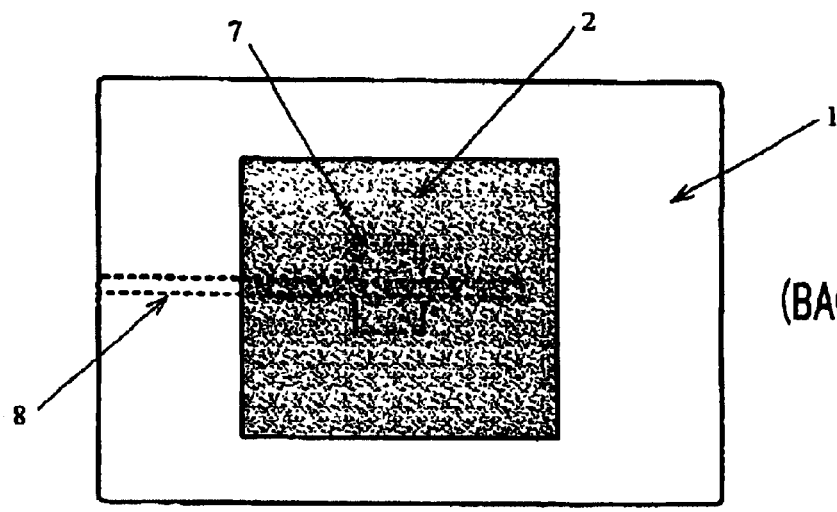
FIGS. 2A and 2B are a plan view and a cross-sectional view, respectively, illustrating a conventional planar circuit designed as a planar antenna.
Figure 2B:
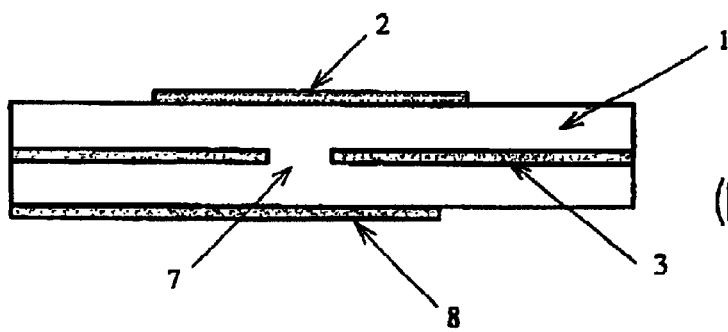

A fixed capacitor may be connected in parallel or in series with varactor diodes 10 as required, such that the center frequency of the variable range of the resonant frequency is adjustable. A plurality of varactor diodes may be arranged along the longitudinal direction of opening 9. Also, while the first embodiment has been described simply in connection with a variable planar resonator, a planar antenna available at variable operating frequencies can be formed by providing ground conductor 3 as an intermediate layer of the substrate, forming an opening in ground conductor 3, and forming a microstrip line electromagnetically coupled to the resonator on the other main surface of substrate 1, as illustrated in the aforementioned FIG. 2.

Figure 4:
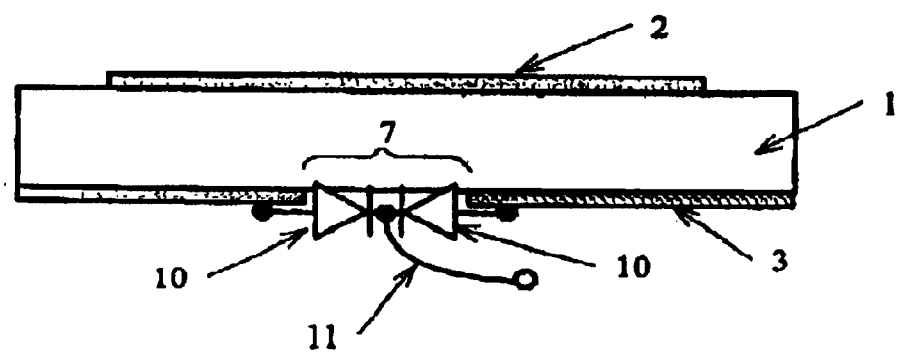
FIG. 4 is a cross-sectional view illustrating a variable planar resonator according to a second embodiment of the present invention.

Next, description will be made on a variable planar resonator according to a second embodiment of the present invention with reference to FIG. 4. It should be noted that in the following description on subsequent embodiments, components identical to those in the first embodiment are designated the same reference numerals, and will not be repeatedly described.

The planar resonator according to the first embodiment has a pair of varactor diodes 10 disposed in a rectangular opening in circuit conductor 2, whereas the planar resonator according to the second embodiment has rectangular opening 7 formed in ground conductor 3 disposed on the other main surface of substrate and has a pair of varactor diodes 10 on rectangular opening 7. Opening 7 formed in ground conductor 3 is positioned beneath circuit conductor 2 formed on one main surface of substrate 1. Circuit conductor 2 is not formed with an opening. The pair of varactor diodes 10 are in opposite polarity connection, in which their cathodes are connected to each other, similar to the foregoing, while the anodes of varactor diodes 10 are connected to ground conductor 3 on both sides of opening 9, respectively.

Likewise, in the foregoing configuration, the opening length is equivalently changed in response to a change in the capacitance of varactor diodes 10 to provide a different boundary condition with a resulting change in the electromagnetic wave field, so that a variable planar resonator can be formed. Similar to the first embodiment, the adaptability and versatility are significantly improved as a resonator to enhance the functionality of the planar resonator in the second embodiment. Further, since varactor diodes 10 need not be embedded in substrate 1 but can be mounted on the other main surface of substrate 1, the manufacturing process is simplified to improve the productivity.

Figure 5A:
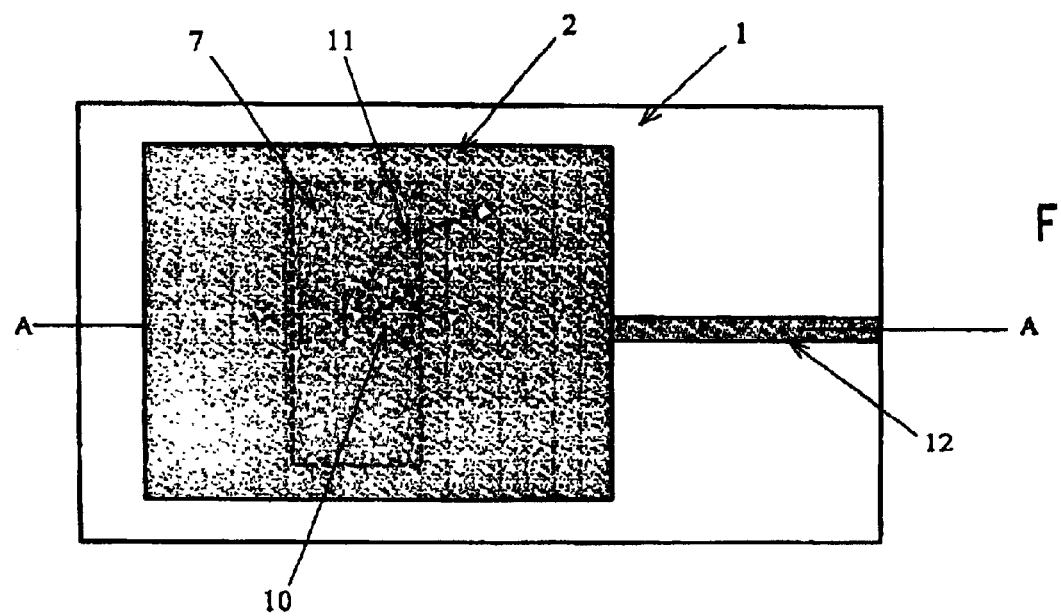
FIG. 5A is a plan view illustrating a planar antenna using the variable planar resonator illustrated in FIG. 4.
Figure 5B:
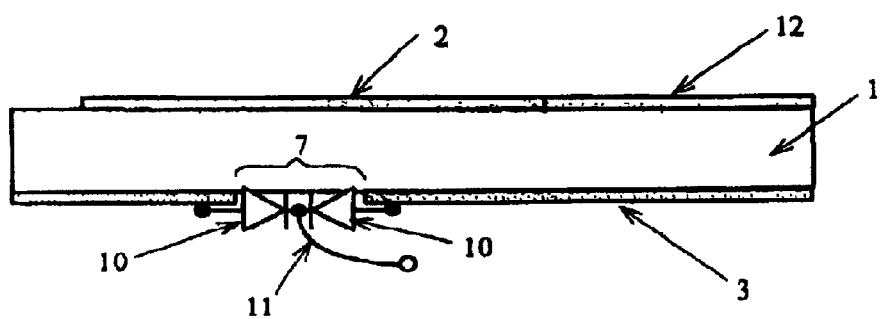
FIG. 5B is a cross-sectional view taken along a line A—A in FIG. 5A.

FIGS. 5A and 5B illustrate an exemplary planar antenna which employs the planar resonator in the second embodiment. Specifically, signal line 12 connected to circuit conductor 2 is routed on one main surface of substrate 1 to implement a planar antenna which is available at variable operating frequencies. FIG. 5A is a plan view seen from the one main surface of substrate 1. In this event, signal line 12 functions as a feeding line having a microstrip line structure, together with ground conductor 3 disposed on the other main surface of substrate 1.

Figure 6A:
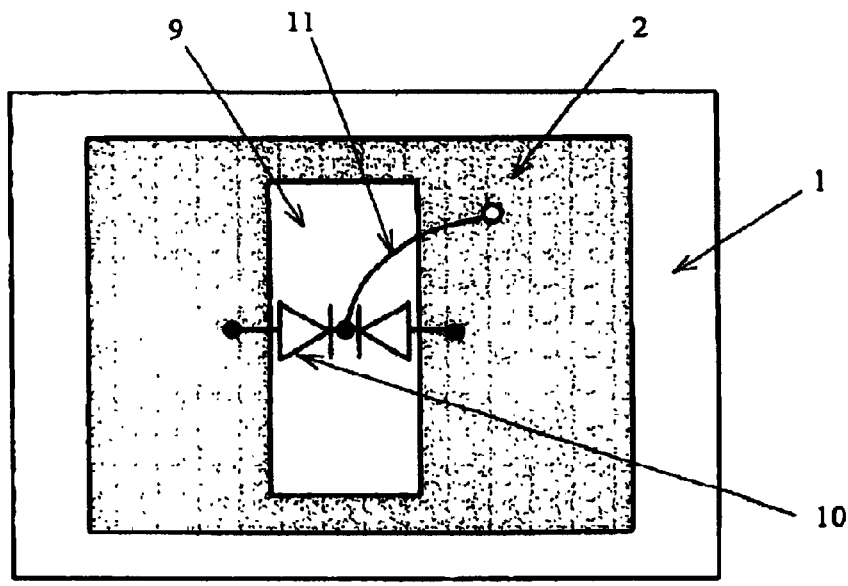
FIGS. 6A, 6B and 6C are a plan view illustrating one main surface, a plan view illustrating the other main surface, and a cross-sectional view of a variable planar oscillator according to a third embodiment of the present invention, respectively.
Figure 6B:
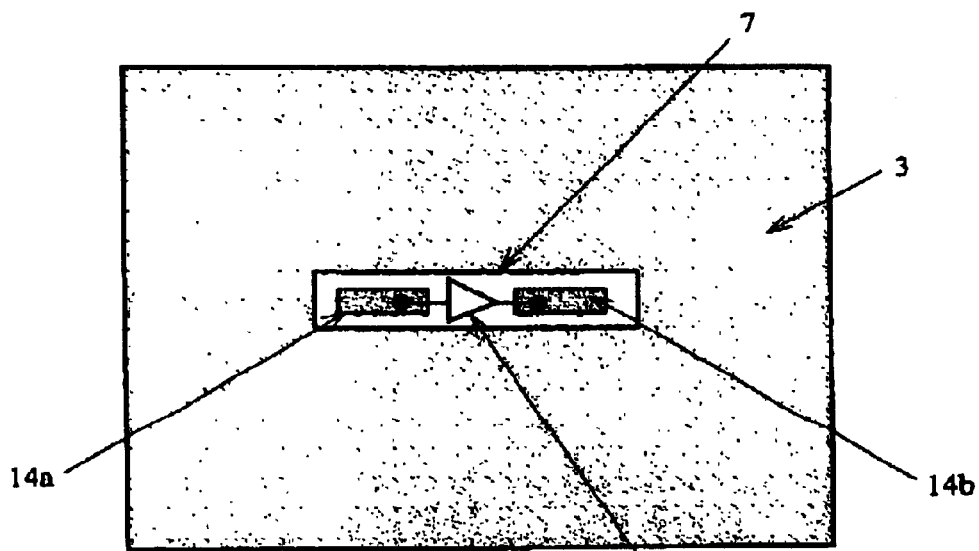

Next, a variable frequency planar oscillator according to a third embodiment of the present invention will be described with reference to FIGS. 6A to 6C.

The planar oscillator of the third embodiment is implemented using the variable planar resonator of the first embodiment. Specifically, the planar oscillator comprises circuit conductor 2 having, for example, a square plane shape on one main surface of substrate 1 which is made of a dielectric material or the like. Circuit conductor 2 is formed with rectangular opening 9. The planar oscillator also comprises a pair of serially connected varactor diodes 10 in opposite polarity configuration, with their cathodes connected to each other. The anodes of varactor diodes 10 are connected to circuit conductor 2 on both sides of opening 9, respectively. A common connection of varactor diodes 10 is applied with a control voltage through supply terminal 11.

Ground conductor 3 on the other main surface of substrate 1 is formed with rectangular opening 7, and a pair of divided signal lines 14a, 14b are disposed within opening 7. The center of opening 7 substantially matches the center of opening 9 across substrate 1, while opening 7 extends in a direction substantially perpendicular to the longitudinal direction of opening 9. Signal lines 14a, 14b form a coplanar line between them and ground conductor 3. Amplifier 15 comprising a semiconductor device including IC (integrated circuit) or the like is connected between signal lines 14a and 14b. Ends of signal lines 14a, 14b, not connected to amplifier 15, are open ends.

Figure 6C:
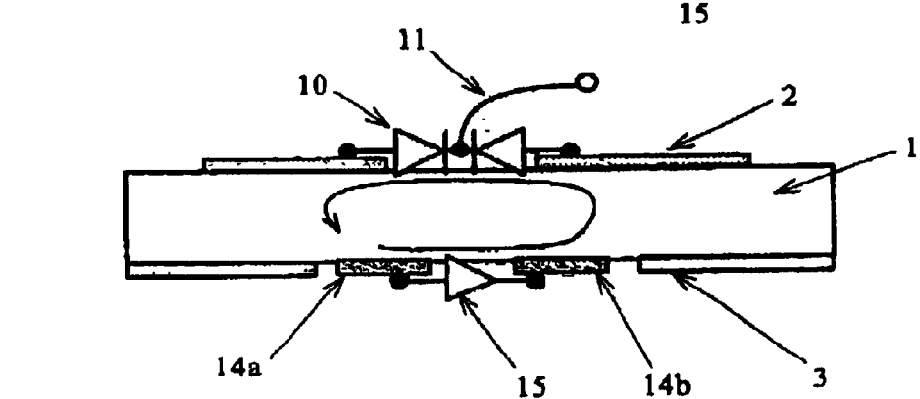

With the employment of the configuration as described, an oscillation closed loop is formed by electromagnetic coupling of the pair of signal lines 14a, 14b and circuit conductor 2, as indicated by an arrow in FIG. 6C. The oscillation frequency in the oscillation closed loop is determined depending on the resonant frequency of the variable planar resonator. Thus, the oscillation frequency can be varied by controlling the capacitance of varactor diodes 10 with a control voltage. In this manner, it is possible to provide a variable planar oscillator configured as a voltage controlled oscillator. In this oscillator, amplifier 15 is disposed on opening 7 and therefore need not be embedded in substrate 1 as before, permitting surface mounting of amplifier 15 on substrate 1 and associated facilitation of manufacturing.

When the planar oscillator illustrated herein is designed to function additionally as a planar antenna by connecting a feeding line to a planar resonator comprising circuit conductor 2 and ground conductor 3, it is possible to realize a transmission module which has a frequency variable oscillating function and an antenna function in combination. Since the transmission module thus configured can vary the oscillation frequency and control ON/OFF state of the oscillation, the functionality of the transmission module can be further enhanced by adding thereto a digital modulation function in accordance with a modulation scheme such as FSK (frequency shift keying), ASK (amplitude shift keying), or the like.

Next, description will be made on a planar resonator which can control mode switching according to a fourth embodiment of the present invention.

Figure 7A:
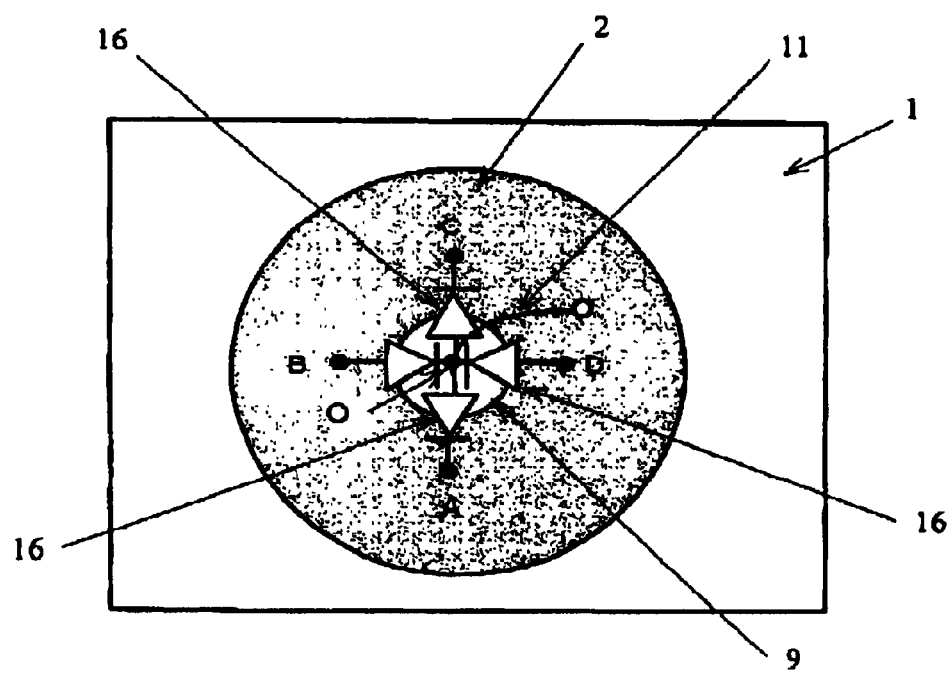
FIGS. 7A and 7B are a plan view and a cross-sectional view, respectively, illustrating a switching control resonator according to a fourth embodiment of the present invention.
Figure 7B:
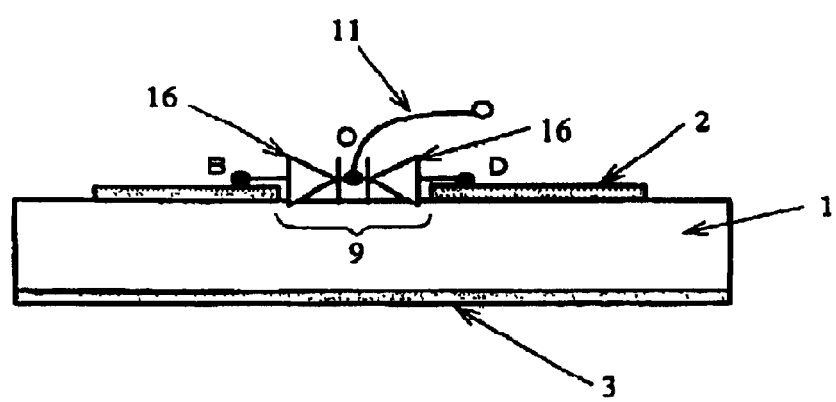

The planar resonator according to the fourth embodiment illustrated in FIGS. 7A and 7B has orthogonal degeneracy modes, and can control switching between these modes. The planar resonator comprises circular circuit conductor 2 on one main surface of substrate 1 which is made of a dielectric material or the like, and circuit conductor 2 is formed with concentric opening 9 having a smaller diameter. Ground conductor 3 is disposed on the overall other main surface of substrate 1. Then, two pairs of switching elements 16, for example, PIN diodes are disposed on small circular opening 9. Each of switching elements 16 is switched ON/OFF in response to a control voltage or bias voltage applied thereto. These four switching elements 16 are connected in star configuration such that opposing elements are in opposite polarity connection to each other. Specifically, anodes of first and third switching elements 16 are connected to common connection O of four switching elements 16, and cathodes of second and fourth switching elements 16 are also connected to common connection O. Then, four points A to D are defined along the periphery of opening 9 at regular intervals on circuit conductor 2, where point A is connected to the cathode of first switching element 16; point B is connected to the anode of second switching element 16; point C is connected to the cathode of third switching element 16; and point D is connected to the anode of fourth switching element 16. Further, supply terminal 11 is connected to common connection O for applying a control voltage for switching. The planar resonator is set in a resonance mode called a $TM_{11}$ mode which has vibration modes degenerated in the horizontal direction and vertical direction in FIG. 7A, respectively.

In the planar resonator as described, as supply terminal 11 is applied with a positive control voltage, switching elements 16 positioned on the upper and lower sides of opening 9, i.e., switching elements 16 connected to point A and point C are made conductive. In this event, the $TM_{11}$ mode in the horizontal direction in FIG. 7A is not excited, whereas the $TM_{11}$ mode in the vertical direction in FIG. 7A is only excited. Conversely, as a negative control voltage is applied, switching elements 16 positioned on the left and right sides of opening 9, i.e., switching elements 16 connected to point B and point D are made conductive. In this event, the $TM_{11}$ mode in the vertical direction is not excited, whereas the $TM_{11}$ mode in the horizontal direction is only excited. In this manner, the $TM_{11}$ mode in the vertical direction or horizontal direction in FIG. 7A can be switched for selection by the control voltage. Likewise, it can be said that the electromagnetic wave field is controlled in the planar circuit since the boundary condition or the like is equivalently changed by the switching elements.

The planar resonator of the fourth embodiment may be provided with a feeding line as described above to form a planar antenna which can transmit or receive horizontally or vertically polarized high frequency radio waves by switching the switching elements to select the resonance in the $TM_{11}$ mode in the horizontal or vertical direction in FIG. 7A. Therefore, the resulting planar antenna has a horizontal/vertical polarization switching function.

Figure 8:
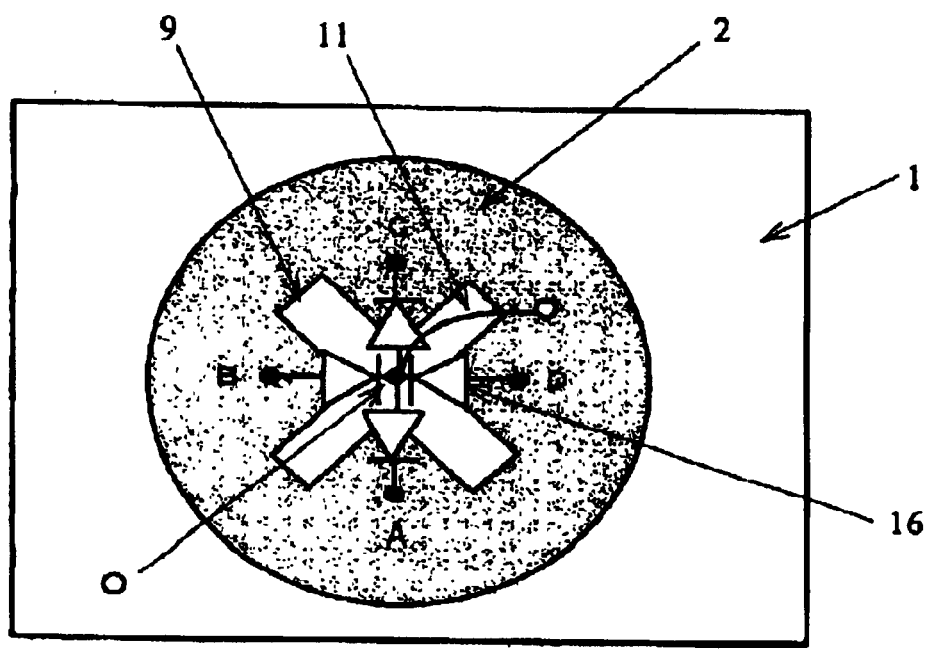
FIG. 8 is a plan view illustrating another switching control resonator according to the fourth embodiment.

In the foregoing example, circuit conductor 2 is formed with circular opening 9. Alternatively, opening 9 may be in a cross shape, as illustrated in FIG. 8. Circular opening 9 can involve a slight mixture between the degenerated modes, such as the vertical $TM_{11}$ mode slightly existing when the horizontal $TM_{11}$ mode is being excited, whereas cross-shaped opening 9 prevents such mixture of modes because a surface current is blocked in different directions.

In the fourth embodiment, switching elements 16 are disposed on one main surface on opening 9, so that surface mounting elements can be employed for the switching elements. For example, a variety of packaged or beam lead type Schottky barrier diodes, PIN diodes, and the like, as well as IC having a switching function and the like can be generally used for the planar resonator. When a used IC has a transceiver function, it is possible to realize a simple full-duplex wireless transceiver which shares an antenna for transmission and reception by setting an input/output port between opposing portions of circuit conductor 2 in close proximity to opening 9, and using vertical polarization for transmission and horizontal polarization for reception.

In the foregoing description, the planar resonator has circular circuit conductor 2, the degenerated resonance mode is the $TM_{11}$ mode which has degenerated modes in orthogonal directions. Alternatively, the planar resonator may have circuit conductor 2, for example, in a square shape and configured to resonate in $TM_{10}$ mode as the degenerated oscillation mode.

In the preferred embodiments of the present invention described above, circuit elements such as variable reactance elements, switching elements and the like are mounted on a surface of substrate 1 through surface mounting. In this event, for example, bumps may be conveniently used to minimize the lengths of lines required for connections.

While substrate 1 is made of a dielectric material in the embodiments for purposes of explanation, the present invention is not limited to the substrate made of a dielectric material, but a substrate made of a magnetic material or a semiconductor substrate, for example, may be used instead. Further, the substrate is not limited to a single substrate, but a plurality of substrates each formed with a planar circuit may be laminated to form a multilayered microwave integrated circuit. Furthermore, each planar circuit described above may be mounted on and connected, for example, through via-holes to a semiconductor substrate which is formed with circuit elements such as a semiconductor device including an integrated circuit and a functional circuit, passive elements, and the like, to form a so-called three-dimensional MMIC (monolithic microwave integrated circuit). In these cases, a significant reduction in size is achieved for electronic apparatuses having planar circuits.

While the variable resonators in the first and third embodiments each comprise varactor diodes to vary the resonant frequency, the varactor diodes may be replaced with switching elements which can be controlled to turn ON/OFF, in which case the variable resonator can be switched between an operative and an inoperative state. The switching elements, applied in this manner, can control an antenna or an oscillator to operate or halt.

In the fourth embodiment, when a plurality of resonance modes exist in orthogonal directions of the planar resonator and are degenerated, any resonance mode is selected by the switching elements. Here, when the planar resonator is not in such a shape that has no degeneracy modes, it is also possible to provide a digital phase shifter, i.e., a so-called line switching phase shifter for shifting the phase by an amount equivalent to a difference in line length between two lines, which is produced when a line extending in any direction is selected by two pairs of switching elements for switching between the vertical direction and horizontal direction. With this phase shifter, the electromagnetic wave field can be controlled in any of basic mode and higher-order mode.

When MOSFET (metal-oxide-semiconductor field effect transistor) or the like is used as a switching element such that the resistance of a variable resistor can be controlled thereby, it is possible to control not only simple ON/OFF states but also transmission amplitude and reception sensibility of an antenna, amplitude of output from an oscillator, and the like, in accordance with the controlled resistance.

While the foregoing embodiments employ varactor diodes which vary the capacitance as a variable reactance element, any of various elements can be utilized, not limited to the varactor diode, as long as it substantially varies the reactance including the inductance in response to a control voltage. Further alternatively, the variable reactance element may be an element or a circuit which can control the reactance as a result, not relying on the voltage.

It should be understood that various modifications can be made to the present invention as appropriate without departing from the spirit and scope of the invention, other than the embodiments described above, and such modifications are intended to be encompassed in the technical scope of the invention. Even with some of elements embedded in a substrate, if circuit elements of a planar circuit are disposed in an opening to control an electromagnetic wave field, which is the gist of the present invention, the planar circuit is regarded as falling under the technical scope of the present invention.

What is claimed is:

1. A planar circuit comprising:
    a substrate;
    a planar circuit conductor disposed on a first main surface of said substrate;
    a ground conductor disposed on a second main surface of said substrate for creating a high frequency resonator based on an electromagnetic wave field in cooperation with said planar circuit conductor; and
    a circuit element disposed on an opening formed in at least one of said planar circuit conductor and said ground conductor, said circuit element being connected to said at least one conductor along the periphery of said opening to electronically control said electromagnetic wave field.

2. The planar circuit according to claim 1, wherein said circuit element is a variable reactance element for varying a resonant frequency of said resonator.

3. The planar circuit according to claim 1, wherein said circuit element is a switching element for switching said resonator to be operative and inoperative.

4. The planar circuit according to claim 1, wherein said circuit element is a switching element, said resonator has resonance modes degenerated in orthogonal directions, and said switching element is operable to control and electronically switch said resonator between said degenerated resonance modes.

5. The planar circuit according to claim 2, wherein said variable reactance element includes a pair of varactor diodes connected in opposite polarity configuration.

6. The planar circuit according to claim 1, wherein said opening is substantially rectangular in shape, and said circuit element connects a pair of opposing sides of said opening.

7. The planar circuit according to claim 6, wherein said circuit element is a variable reactance element for varying a resonant frequency of said resonator.

8. The planar circuit according to claim 1, wherein said opening is circular in shape, and said circuit element connects a plurality of points defined along the periphery of said opening at equal intervals.

9. The planar circuit according to claim 1, further comprising a signal line connected to said planar circuit conductor on said first main surface, said signal line acting in cooperation with said ground conductor to provide a feeding line in a microstrip line structure, wherein said planar circuit functions as a planar antenna.

10. The planar circuit according to claim 1, wherein said substrate is made of a dielectric material.

11. The planar circuit according to claim 10, wherein said planar circuit conductor comprises a substantially rectangular plane shape, said opening is substantially rectangular in shape, and said circuit element connects a pair of opposing sides of said opening.

12. The planar circuit according to claim 11, wherein said circuit element is a variable reactance element for varying a resonant frequency of said resonator.

13. The planar circuit according to claim 10, wherein said planar circuit conductor comprise a substantially circular plane shape, said opening is provided in said planar circuit conductor and is circular in shape, and said circuit element connects a plurality of points defined along the periphery of said opening at equal intervals.

14. The planar circuit according to claim 13, wherein said circuit element is a switching element, said resonator has resonance modes degenerated in orthogonal directions, and said switching element is operable to control and electronically switch said resonator between said degenerated resonance modes.

15. A planar circuit comprising:

a substrate;

a planar circuit conductor disposed on a first main surface of said substrate;

a ground conductor disposed on a second main surface of said substrate for creating a high frequency resonator based on an electromagnetic wave field in cooperation with said planar circuit conductor;

a circuit element disposed on a first opening of a rectangular shape formed in said planar circuit conductor for electronically controlling said electromagnetic wave field;

a signal line disposed in a second opening formed on said ground conductor as a slot line; and an amplifier connected to said signal line, wherein a portion of said planar circuit conductor sandwiching said first opening, said signal line, and said amplifier form an oscillation closed loop, so that said planar circuit functions as an oscillator.

16. The planar circuit according to claim 15, wherein said circuit element is a variable reactance element for varying a resonant frequency of said resonator.

17. The planar circuit according to claim 16, wherein said variable reactance element includes a pair of varactor diodes connected in opposite polarity configuration.

18. The planar circuit according to claim 15, wherein said substrate is maid of a dielectric material, said planar circuit conductor is substantially rectangular in shape, and a longitudinal direction of said first opening is substantially perpendicular to a longitudinal direction of said second opening.

* * * * *